United States Patent

[11] 3,593,174

[72] Inventor Marvin H. White Laurel, Md.
[21] Appl. No. 830,671
[22] Filed June 5, 1969
[45] Patented July 13, 1971
[73] Assignee Westinghouse Electric Corporation Pittsburgh, Pa.

[54] SOLID STATE AMPLIFIER FOR MICROWAVE FREQUENCY SIGNALS
8 Claims, 3 Drawing Figs.

[52] U.S. Cl. .......... 330/53, 330/124
[51] Int. Cl. .......... H03f 3/60
[50] Field of Search .......... 330/53, 38 M

[56] References Cited
UNITED STATES PATENTS 2,957,143 10/1960 Enloe .......... 330/30
3,293,557 12/1966 Denton .......... 330/53 X
3,390,333 6/1968 Klawsnik et al. .......... 330/53 X

*Primary Examiner*—Nathan Kaufman
*Attorneys*—F. H. Henson and E. P. Klipfel

ABSTRACT: A solid state apparatus for amplifying signals in the microwave frequency range by phase coherent addition of the signal output of a plurality of amplifier elements achieves high power output and wide bandwidth operation, with improved signal-to-noise ratio while operating within the permissible limits of power gain for each of the amplifying elements. A plurality of parallel connected, solid state amplifiers are connected at equally spaced distances between tapered input and output transmission lines which, respectively, distribute microwave power equally to each of the parallel connected amplifier elements and provide for phase coherent addition of the signal outputs of each of the amplifier elements.

INVENTOR
MARVIN H. WHITE

BY Ernest P. Klipfel

ATTORNEY

INVENTOR
MARVIN H. WHITE

BY Ernest P. Klipfel

ATTORNEY

SOLID STATE AMPLIFIER FOR MICROWAVE FREQUENCY SIGNALS

BACKGROUND OF THE INVENTION

1. Field of the Invention

This invention relates to an apparatus for amplifying microwave frequency signals and more particularly, to a microwave frequency amplifier utilizing transversal amplification techniques.

2. Description of the Prior Art

Numerous microwave frequency systems utilize miniaturized solid-state components for amplifying microwave frequency signals. For example, in phased array radar systems each attenule, or combination of receiver and radiating dipole, is ideally spaced in the array at a distance of one-half wavelength ($\lambda/2$) from an adjacent attenule. The amplifier for the signal output of the dipole preferably is constructed to fit within the attenule and thus, must be limited in its lateral dimensions to a distance of less than one-half wavelength. For example, when operating in the X band (wavelengths of 3 centimeters and less), the amplifier must be approximately 1 centimeter, and preferably less, in the lateral dimension, so as not to physically interfere with the location of adjacent attenules in the array.

There have been prior attempts to design high-power semiconductor amplifiers for microwave frequency signals. Some of those attempts have been directed to scaling-up, or reinforcing, individual low-power transistors to permit operation at high current levels for obtaining higher power outputs. Such scaling-up, or reinforcing, is accomplished by interdigitation, or interdigitation-overlay techniques. Such scaled-up devices have generally been unsatisfactory in operation, in that the input impedance level of the resulting transistor is reduced below that required for proper impedance matching. Thus, high-power capability of such scaled-up transistors is realized only at the expense of an unsatisfactory decrease in the bandwidth.

Another prior art attempt is to connect low-power, high-bandwidth transistors by suitably chosen interstage coupling or matching networks in a parallel array of cascaded amplifiers. However, cascading inherently reduces bandwidth. Cascading also results in severe transmission line losses due to the necessity of coupling the cascaded transistors between their respective inputs and outputs, which are of different impedance values.

Other attempts have been directed to obtaining microwave power outputs in excess of the power output available from a single microwave amplifier by combining the outputs of a plurality of interconnected amplifiers. For example, the power outputs of an array of several amplifier elements may be combined with a power dividing network. However, the bandwidth response of the resultant amplifier array is again reduced, and, in addition, the physical configuration of the amplifier array is not compatible with the above-discussed requirement of maintaining minimum lateral dimensions of such amplifiers.

In general, therefore, the solid-state microwave amplifiers available heretofore in the prior art have been unsatisfactory, either in not achieving desired high-power output levels, or in achieving high-power output levels only at the expense of undesired, and generally unacceptable, reductions in operating bandwidth or increase in physical size, and/or forming the amplifiers in physical configurations incompatible with microwave system requirements.

SUMMARY OF THE INVENTION

These and other defects and inadequacies of the prior art are overcome by the apparatus of the invention.

The apparatus of the invention provides for transversal amplification of signals in the microwave frequency range by distributing the microwave input power equally to a plurality [N] of parallel connected amplifier elements each having wide bandwidth response and low-power gains at microwave frequencies. Each of the amplifier elements has an input impedance of $Z_0$ and an output impedance of $Z_0'$. A tapered input transmission line, or microstrip, having a characteristic impedance of $Z_0/N$ at its input port, distributes input power to each of the amplifier elements such that $1/N$ of the input power is distributed to each of the amplifier elements. A tapered output transmission line, having a characteristic impedance of $Z_0'/N$ at its output port, is physically spaced from the input transmission line, and combines the individual power outputs of the amplifier elements in phase coherent relationship. The resultant amplifier has a greatly increased power output characteristic which is a direct function of the number [N] of component transistor amplifier elements, while operating within the permissible limits of power gain and output of each amplifier element. The bandwidth characteristics of the amplifier are equal to those of the individual amplifier elements, and the signal-to-noise ratio thereof, in operation, is improved over that of each component element. The physical dimensions and configuration of the amplifier of the invention are minimized in the lateral direction rendering the amplifier ideally suited for use with microwave systems, despite the stringent construction requirements thereof, as described above.

These and other features and advantages of the apparatus of the invention will become apparent and more fully understood from the following detailed description of the invention.

DETAILED DESCRIPTION OF THE PREFERRED EMBODIMENT

Figure 1:
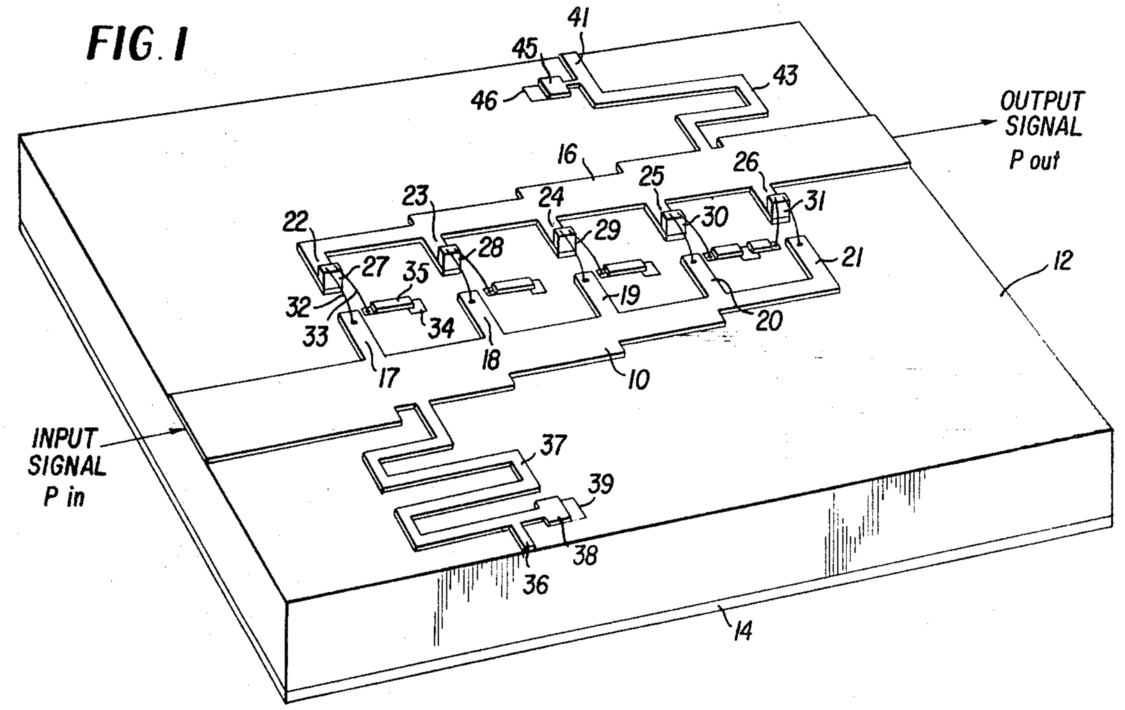
FIG. 1 is a perspective view of the solid-state transversal amplifier of the invention.

In FIG. 1 there is shown a perspective view of the transversal amplifier of the invention. As used hereinafter, transversal amplification comprises the achieving of increased power output of an amplifier system by employing a plurality of amplifiers, the outputs of which are combined through phase coherent addition. Phase coherent addition has been employed heretofore in other electronic devices, such as in phase coherent detectors and transversal filters.

In FIG. 1, there is shown a substantially lossless input transmission line, including a flat metallic conductor or microstrip 10 deposited on the dielectric substrate 12 above a ground plane 14. A substantially lossless output transmission line, including a flat metallic conductor or microstrip 16 is also shown in FIG. 1. Microstrips 10 and 16 are deposited on the dielectric substrate 12, for example, ceramic, by conventional integrated circuit manufacturing techniques. The resultant combination of microstrips 10 and 16, the dielectric substrate 12, and ground plane 14 constitutes input and output transmission lines, respectively, for propagating microwave frequency signals. Hereinafter microstrip 10 will be referred to as input transmission line 10 and microstrip 16 will be referred to as output transmission line 16. Input transmission 10 includes a plurality of distribution line input sections 17 to 21 and output transmission line 16 similarly includes a plurality of distribution line output sections 22 to 26. Identical solid-state amplifier elements 27 to 31 are physically mounted on the output sections 22 to 26, respectively, of the output transmission line 16.

Although a total of five amplifier elements 27 to 31 are shown in FIG. 1, any desired number of amplifier elements, from two to N, may be employed in accordance with the invention. Each amplifier element 27 to 31, may comprise any suitable high frequency, wide bandwidth solid-state element capable of amplifying signals in the microwave frequency range. Typically, such elements are of low power, relative to the required power output capability of microwave systems. An example of a suitable element is the Schottkey Barrier Gate Field Effect Transistor. In practice, and as will be explained hereafter, an amplifier element would be selected which provides a maximum power output while having acceptable characteristics of gain-bandwidth product and input and output impedance values ($Z_0$ and $Z_0'$, respectively) as required for matching to the input and output transmission lines to which the element is coupled.

As described hereinafter, each of the distribution line sections 17 to 21 of input transmission line 10 is designed to match the input impedance $Z_0$ of each of the amplifier elements 27 to 31 such that there is no reflection of the input power signal at the input to the amplifier elements. Similarly impedance matching is effected between the output sections 22 to 26 of output transmission line 16 and the output impedance $Z_0'$ of the corresponding amplifier elements 27 to 31 to avoid reflections at the outputs of the amplifier elements. Input transmission line 10 and output transmission line 16 are tapered, in several stepped sections, in the lateral direction and possess differing values of characteristic impedance in the stepped sections as will be explained in connection with FIG. 2.

In the embodiment of FIG. 1, a conductive lead 32 connects the distribution line sections 17 to 21 of input transmission line 10 to amplifiers 27 to 31 and conductive lead 33 connects the emitter terminals of amplifier elements 27 to 31 to a grounding pad 34 through a resistor-capacitor strip 35. The RC strip 35 functions as a conventional emitter RC network in a common emitter amplifier configuration. The amplifier elements 27 to 31 are mounted on output sections 22 to 26 at their collector terminals. The conductive leads 32 and 33, and RC strip 35, and grounding pad 34 have been numbered in the drawing only with respect to amplifier element 27. However, each of the other amplifier elements 28 to 31 has associated therewith similar conductive leads, RC strips, and grounding pads which function in the same manner as those associated with amplifier element 27. Also shown in FIG. 1 is a DC bias input terminal 36 and a choke coil 37. A conventional capacitive element 38 is connected between the choke coil 37 and a grounding pad 39. The embodiment of FIG. 1 also includes a second DC bias input terminal 41 and a second choke coil 43 connected to output transmission line 16. A capacitive element 45 is connected between the choke coil 43 and a grounding pad 46.

In operation, a suitable biasing or energizing source is connected to input terminals 36 and 41 to bias the collector and emitter terminals of amplifier elements 27 to 31. The choke coils 37 and 43 function conventionally to prevent microwave input and output signals from propagating in the direction of the biasing sources, and capacitive elements 38 and 45 provide additional coupling of microwave frequency signals to ground.

As shown in FIG. 1, the resultant arrangement of amplifier elements and input and output transmission lines of the transversal amplifier of the invention permits of an elongated, relatively narrow configuration. The lateral dimensions of the total structure may therefore be of the order of 1 centimeter or less, permitting convenient use thereof, and compatibility with other components of microwave systems.

Figure 2:
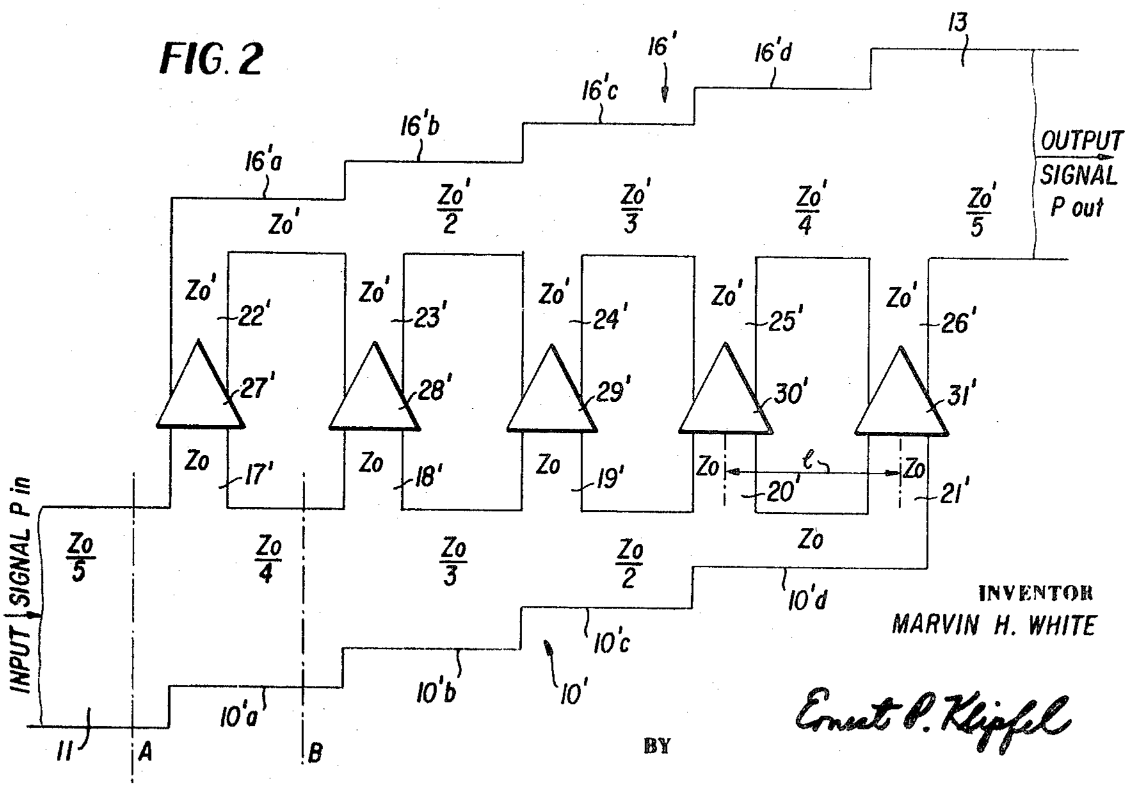
FIG. 2 is a schematic diagram of the transversal amplifier of the invention.

FIG. 2 is a schematic diagram of the transversal amplifier of the invention. In FIG. 2 a plurality of identical solid-state amplifier elements 27' to 31' are connected in parallel relationship at equally spaced distances of $l$ between a substantially lossless input transmission line 10' and a substantially lossless output transmission line 16'. Input sections 17' to 21' of input transmission line 10' are connected to the inputs of amplifier elements 27' to 31'. Each of the input sections 17' to 21' is designed so that the characteristic impedance of each input section matches the input impedance $Z_0$ of each of the amplifier elements 27' to 31'.

Output sections 22' to 26' of output transmission line 16' are connected to the outputs of each of the amplifier elements 27' to 31'. Each of these output sections is designed to have a characteristic impedance that matches the output impedance $Z_0'$ of the amplifier elements. Thus, there is no reflection of the input signal at the input to amplifier elements 27' to 31' and there is similarly no reflection at the outputs of these elements. The input transmission line 10' is tapered in stepped sections (10*a'*—10*d'*) of decreasing lateral thickness from an input port 11, such that the characteristic impedance of the transmission line varies from a value of $Z_0/5$ at the input port 11 to $Z_0$ in stepped section 10*d'*, where $Z_0$ is the input impedance of each of the amplifier elements 27' to 31'. The output transmission line 16' is tapered, in several stepped sections (16*a'*—16*d'*), and is of increasing lateral thickness in the direction approaching its output port 13. The characteristic impedance of the output transmission line varies from a maximum value of $Z_0'$ in stepped section 16*a'* to a minimum value of $Z_0'/5$ at output port 13, where $Z_0'$ is the output impedance of each of amplifier elements 27' to 31'.

The input transmission line 10' is tapered so as to distribute microwave frequency input power $P_{in}$ equally to each of the amplifier elements 27' to 31', and the output transmission line 16' is tapered so as to permit phase coherent addition of the output signals of each of these amplifier elements. The manner in which microwave input power $P_{in}$ is distributed equally to each of the amplifier elements 27' to 31' may be seen from the following explanation. Input power $P_{in}$ is not reflected back toward the input port 11 at imaginery boundary A–A' since there is an impedance match at this boundary wherein the characteristic impedance $Z_0/5$ looking to the left of the boundary A–A' is equal to the characteristic impedance looking to the right of the boundary A–A'. The characteristic impedance to the right of boundary A–A' is shown by the relationship:

$$Z=\frac{Z_1\cdot Z_2}{Z_1+Z_2} \quad (1)$$

where $Z_1$ is the impedance $Z_0/4$ of the input transmission line 10' to the right of the boundary A–A', and $Z_2$ is the impedance, $Z_0$, of input section 17'. Substituting in equation (1), therefore, $Z=Z_0/5$.

Further, the input power $P_{10}$ to amplifier element 10 is defined by:

$$P_{10}=\left(\frac{Z_1}{Z_1+Z_2}\right)P_{in} \quad (2)$$

Therefore:

$$P_{10}=\left(\frac{Z_0/4}{Z_0/4+Z_0}\right)P_{in}=1/5P_{in} \quad (3)$$

Similarly, at imaginery boundary B–B' none of the input power $Z_0/4$ at the boundary is reflected since there is again an impedance match. The impedance looking to the left of the boundary B–B' is $Z_0/4$ and the impedance looking to the right of this boundary B–B' is also $Z_0/4$, as shown by the relationship:

$$Z=\frac{Z_3\cdot Z_4}{Z_3+Z_4} \quad (4)$$

where $Z_3$ is the impedance of the input transmission line 10' to the right of the boundary B–B' and $Z_4$ is the impedance $Z_0$ of input section 18'. The power $P_{11}$ into the amplifier element 11 is given by the following relationship:

$$P_{11}=\left(\frac{Z_3}{Z_3+Z_4}\right)P_{in} \quad (5)$$

where $P_{in}'$ is $P_{in}-1/5\ P_{in}$ or $4/5\ P_{in}$. Therefore:

$$P_{11}=\frac{Z_0/3}{Z_0/3+Z_0}\Big)4/5P_{in} \text{ or } P_{11}=1/5P_{in} \quad (6)$$

It can be seen from this mathematical analysis that the input transmission line 10 distributes one-fifth of the input power to each of the amplifier elements 27' to 31'. In transversal amplifiers employing N elements, the input transmission line distributes 1/N of the input power to each element.

Figure 3:
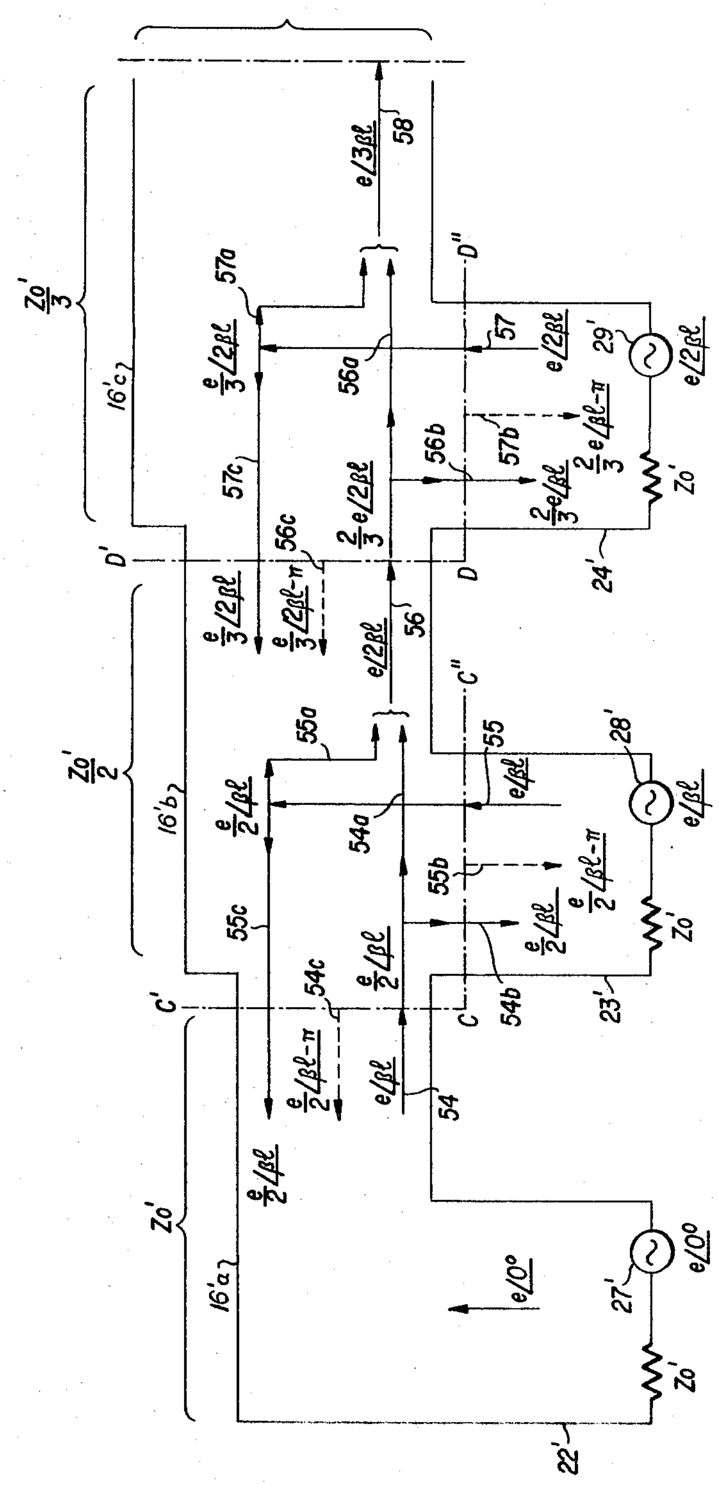
FIG. 3 is a schematic of a portion of the transversal amplifier of the invention.

In FIG. 3 there is shown a schematic of a portion of the output transmission line 16'. Phase coherent addition of the output signals from the amplifier elements consistent with the transversal amplification technique can best be appreciated from the following mathematical description. The principle of superposition is applicable to linear systems having matched impedance conditions at input and output terminals and substantially lossless transmission lines. Therefore, the amplifier elements 27' to 31' may be considered as excitation generators, and the voltage output of each excitation generator may be analyzed exclusively of the others.

In FIG. 3 the amplifier element 27' has been represented as an excitation generator having an output voltage of amplitude $e$ at an angle of 0° driving into an output impedance of $Z_0'$. At the imaginery boundary C–C', the amplifier element 27' is effectively an excitation generator having an output voltage wave 54, of amplitude $e$ at an angle of $\beta l$ where $l$ is the propagation vector $2\pi/\lambda$ and $l$ is the distance between corresponding portions of the transmission line output section and thus the distance between amplifier elements. The reflection coefficient $\Gamma_{C-C'}$ at the boundary C–C' is given by the relationship:

$$\Gamma C-C'=\frac{Z_{in}'-Z_0'}{Z_{in}'+Z_0'} \qquad (7)$$

where $Z_{in}'$ is the impedance of the output transmission line to the right of boundary C–C' and $Z_0'$ is the impedance to the left of the boundary C–C'. By reference to equation (1) above, $A_{in}'$ is;

$$Z_{in}'=\frac{Z_0'/2\cdot Z_0'}{Z_0'/2+Z_0'} \text{ or } 1/3\ Z_0' \qquad (8)$$

Therefore:

$$\Gamma C-C'=\frac{1/3Z_0'-Z_0'}{1/3Z_0'+Z_0'} \text{ or} -1/2 \qquad (9)$$

Thus, the reflection coefficient at C–C' is −½ and the reflected voltage wave 54c is altered in phase by 180° since it encounters a section of transmission line of lower characteristic impedance than $Z_0'$. A voltage wave having components 54a and 54b, each of amplitude $e/2$ at an angle $\beta l$ is propagated across boundary C–C' in both the output transmission line 16b' and output section 23'.

Considering next the second excitation generator 28' having an output voltage wave 55 of amplitude $e$ at an angle of $\beta l$, the reflection coefficient at boundary C–C'' is similarly −½. Therefore a voltage wave 55b of amplitude $e/2$ at an angle of $\beta l-\pi$ is reflected back toward excitation generator 28'. The voltage waves 54b and 55b cancel each other since they are of the same amplitude and opposite phase. A voltage wave having components 55a and 55c, each of amplitude $e/2$ and angle $\beta l$ is propagated across boundary C–C'' into the output transmission line 16b'. Voltage wave 55c cancels voltage wave 54c since these waves are of the same amplitude and opposite phase. Therefore there is no net propagation back toward excitation generator 27'. Voltage waves 54a and 55a are of the same amplitude and phase and are additive such that there is net propagation to the right of a voltage wave 56 of amplitude $e$ at an angle of $2\beta l$ propagating in a section of transmission line having a characteristic impedance of $Z_0'/2$.

The reflection coefficient at boundary D–D' is −⅓ and a voltage wave 56c of amplitude $e/3$ at an angle of $2\beta l-\pi$ is reflected. A voltage wave having components 56a and 56b, each of amplitude ⅔e at an angle of $2\beta l$ is propagated across boundary D–D' into the output transmission line 16c' and output section 24'.

Considering next the effect of excitation generator 29', having an output voltage wave 57, the reflection coefficient at boundary D–D'' is −⅔ such that a voltage wave 57b of ⅔e at an angle of $2\beta l-\pi$ is reflected toward excitation generator 29'. Voltage wave 57b cancels wave 56b since the waves are of equal amplitude and opposite phase. A voltage wave having components 57a and 57c, each of amplitude $e/3$ at an angle of $2\beta l$ is propagated across boundary D–D'' into the output transmission line, the wave 57c cancelling wave 56c and wave 57a combining in phase with the wave 56a. Thus there is a net propagation to the right of a voltage wave 58 of amplitude $e$ and an angle $3\beta l$ propagating in a characteristic line impedance of $Z_0$⅓. Thus the amplitude of the voltage wave propagating toward the right in the output transmission line is constant in amplitude while changing phase uniformly as the wave propagates toward the transmission line output port. Since the characteristic impedance of the output transmission line is decreasing in value as the voltage wave moves towards the output port, there is power flow increasing toward the right.

The total power output of the transversal amplifier is given as $$P_{OUT}=\frac{|eN|^2}{Z_{LOAD}} \qquad (10)$$

where $N$ is the total number of amplifier elements in the transversal amplifier and $Z_{LOAD}$ is the output load impedance of the transversal amplifier $Z_0'/N$. Therefore:

$P_{out}=N^{e2}/Z_0'$ (11)

Since the power output of one amplifier element, $P_{element}$, having an output impedance of $Z_0'$ and a signal amplitude of $e$ is:

$P_{element}=e^2/Z_0'$ (12)

the total power output of the transversal amplifier is:

$P_{OUT}=NP_{element}$ (13)

The power gain of the transversal amplifier may be expressed in terms of the characteristic scattering (S) parameters of the individual amplifier elements. Considering the overall scattering parameters of the transversal amplifier, the forward insertion gain is:

$$S_T=\left(\frac{-i_{OUT}}{i_{IN}}\right)\left(\frac{2(Z_0'/N)}{Z_{IN}+(Z_0'/N)}\right) \qquad (14)$$

where $i_{OUT}/i_{IN}$ is the current gain of the overall transversal amplifier. Since $Z_{IN}=Z_0/N$, equation (14) may be written as:

$$S_T=-\frac{i_{OUT}}{i_{IN}}\left(\frac{2Z_0'}{Z_0+Z_0'}\right)=\frac{i_{OUT}}{i_{IN}}\gamma_F \qquad (15)$$

where $\gamma_F=(-2Z_0')/(Z_0+Z_0')$ is the forward current transmission coefficient of the transversal amplifier. Thus each amplifier element contributes a portion of its output voltage to the voltage wave moving from left to right and a portion of its output voltage to cancel backward reflection. Amplifier element 29' contributes less of its output voltage to the forward voltage wave and more to cancel the backward reflections than does amplifier element 28'. However, the overall result is as though each amplifier element contributes equally with respect to the total current and power gain of the composite transversal amplifier. Thus, the total current gain, $i_{OUT}/i_{IN}$, is as though it were produced by a single amplifier element. Because of this factor, the forward insertion gain of the transversal amplifier $S_T$ is equal to the forward insertion gain of one amplifier element where it is noted that the S-parameters are determined under matched impedance conditions at input and output terminals.

The above analysis demonstrates that the bandwidth of the transversal amplifier is identical to the bandwidth of a single amplifier element, and the power gain of the transversal amplifier is identical to the power gain of a single amplifier element. Also, the total power output (equations 11 and 13) of the transversal amplifier is N times the power output of a single amplifier element operating into a matched load.

The signal-to-noise ratio of the composite transversal amplifier is considerably improved over that of an individual amplifier element due to the coherent phase addition of the output signals of each amplifier element. Considering N random noise generators (uncorrelated), one being associated with each amplifying element in the transversal amplifier, then the improvement in signal-to-noise may be expressed as:

$$\frac{\left(\frac{S}{N_{TRANS}}\right)}{\left(\frac{S}{N_{element}}\right)}=\frac{\frac{(Ni_S)^2}{(\sqrt{N}i_N)^2}}{\frac{(i_S)^2}{(i_N)^2}}=N \qquad (16)$$

where $N$ is the number of amplifiers in the transversal amplifier, $i_S$ is the signal current of each amplifier element, and $i_N$ is the associated noise current of the generator. Therefore, the signal-to-noise ratio is improved by a factor of $N$.

The transversal amplifier of the invention thus provides high-power output at microwave frequencies by the phase coherent addition of the output of a plurality of amplifier elements. Some of the advantages of the transversal amplifier of the invention are shown by way of a specific example. Presently available microwave frequency solid-state amplifier elements may typically have the following characteristics at a frequency of 3 GHz.: maximum available power gain of 10 db. (power amplification of 10), maximum power output of 50 milliwatts, and signal-to-noise ratio of 2.5. Thus a minimum of 5 milliwatts of input power produces maximum power output. By employing a plurality of five of such amplifier elements ($N$=5) the total output power output of the transversal amplifier is 250 milliwatts since the total power output of the transversal amplifier is five times the power output of one amplifier. The power gain of the transversal amplifier is 10 db. and the signal-to-noise ratio is improved five times to a value of 12.5. Yet the resultant transversal amplifier maintains the high bandwidth response of the single amplifier element.

In summary, the transversal amplifier of the invention provides for use of a plurality of amplifier elements connected effectively in parallel relationship, for receiving predetermined fractional portions, related to the number of amplifier elements, of the power of the input signal. The transversal amplifier further provides for phase coherent addition of the outputs of the component amplifier elements. The plurality of amplifier elements may be represented in number by the variable N, which may range from two to any desired number. Preferably, the amplifier elements are identical to each other and receive the fractional portion 1/N of the input signal, and thus of the input power. The phase coherent addition of the outputs of the individual amplifier elements provides an output power for the transversal amplifier of N times that of a single element, while having a power gain equal to that of a single element, and a signal-to-noise ratio of N times that of a single element. Further, the bandwidth of the composite transversal amplifier is equal to that of a single element. The physical size and configuration of the composite structure is such as to render the transversal amplifier compatible with numerous microwave systems applications and their requirements.

The disclosed configuration of a tapered input and output transmission line, each being in stepped sections, is illustrative of one embodiment of the actual configuration of the transversal amplifier of the invention. Other configurations are applicable to the teachings of the invention if the input transmission line distributes input power equally to each of the amplifier elements and the output transmission line effects phase coherent addition of the output signals of the amplifier elements.

I claim as my invention:

1. A transversal amplifier for amplifying signals in the microwave frequency range comprising; a plurality of solid-state elements capable of amplifying signals of microwave frequencies, input means for receiving microwave frequency input signals and for distributing the signal power of those signals substantially equally to each of a plurality of amplifying means, and output means connected to the output of each of said amplifying means for effecting phase coherent addition of the signal outputs of said amplifying means to provide a composite output signal of increased power and improved signal-to-noise ratio relative to the output signals of the individual amplifying means while maintaining the operating bandwidth of an individual amplifying means the same as that of said transversal amplifier, said input means including a transmission line having an input port and a tapered impedance section including a plurality of input distribution lines respectively associated with said plurality of amplifying means, each of said input distribution lines having a characteristic impedance matching the input impedance of its respective associated amplifying means to provide a nonreflective connection at the input to said amplifying means, said output means comprising an output transmission line having a tapered impedance section including a plurality of output distribution lines associated respectively with said plurality of amplifying elements and connected to a common output port, each of said output distribution lines having a characteristic impedance matching the output impedance of its respective associated amplifying means to thereby provide phase coherent addition of the outputs of said plurality of solid-state elements.

2. A transversal amplifier as recited in claim 1 wherein:

said input and output transmission lines comprise planar microstrip conductors disposed in parallel relationship and formed in steps of decreasing and increasing widths, respectively, corresponding to said successively tapered sections thereof, and said input and output distribution lines comprise planar microstrip conductor segments integrally formed with the corresponding tapered sections of said input and output microstrip conductors in generally perpendicular, coplanar relationship thereto and extending from the adjacent edges of said parallel input and output transmission lines with said conductor segments displaced in equal intervals along the adjacent edges of said parallel microstrip conductors.

3. A transversal amplifier as recited in claim 2 wherein said microstrip conductor segments defining corresponding said input and output distribution lines are positioned in aligned relationship.

4. A transversal amplifier as recited in claim 2 wherein each of said amplifying means is mounted on the respectively associated output distribution line and is electrically connected thereto by said mounting thereon and is electrically connected to a signal input terminal of the respectively associated input distribution line.

5. A transversal amplifier as recited in claim 4 wherein said microstrip conductors further include planar bias conductors integrally formed therewith for connection to an energizing source for energizing said amplifying means, and said bias conductors include isolation means for preventing the propagation of microwave signals therethrough to said energizing source.

6. A transversal amplifier as recited in claim 2 wherein said microstrip conductors and conductor segments of said input and output transmission lines and associated distribution lines are deposited on a planar substrate of dielectric material, and there is further provided a planar ground plane formed on an opposite surface of said substrate in parallel relationship to the plane of said microstrip conductors and conductor segments.

7. A transversal amplifier as recited in claim 1 having N amplifying means wherein:

each of said amplifying means has a characteristic input impedance of $Z_0$, each of said input distribution lines has a characteristic impedance of $Z_0$ to provide a nonreflective connection at the input to the corresponding amplifying means, said input transmission line includes N−1 successively stepped sections from said input port and terminates in the distribution line for the $N^{th}$ amplifying element, and said input transmission line has a characteristic impedance of $Z_0/N$ at said input port and a characteristic impedance of $Z_0/(N-n)$ for successive ones of said sections where $n$ =1,2,...$N$−1 and identifies the amplifying means corresponding to each section, preceding said termination of said input transmission line in said input distribution line for said $N^{th}$ amplifying means.

8. A transversal amplifier as recited in claim 7 wherein:

each of said output distribution lines has a characteristic impedance of $Z_0'$, and said output transmission line includes $N$−1 successively stepped sections having characteristic impedances of $Z_0'/n$ where $n$=2,3,...$N$−1 and identifies the amplifying means corresponding to each section, and an output port of characteristic impedance $Z_0'/N$.